US009019327B2

(12) United States Patent
Kawabe

(10) Patent No.: US 9,019,327 B2
(45) Date of Patent: Apr. 28, 2015

(54) DISPLAY DEVICE

(71) Applicant: Global OLED Technology LLC, Wilmington, DE (US)

(72) Inventor: Kazuyoshi Kawabe, Yokohama (JP)

(73) Assignee: Global OLED Technology LLC, Wilmington, DE (US)

( * ) Notice: Subject to any disclaimer, the term of this patent is extended or adjusted under 35 U.S.C. 154(b) by 0 days.

(21) Appl. No.: 14/245,694

(22) Filed: Apr. 4, 2014

(65) Prior Publication Data

US 2014/0218417 A1  Aug. 7, 2014

Related U.S. Application Data

(63) Continuation of application No. 13/319,499, filed as application No. PCT/US2010/036384 on May 27, 2010, now Pat. No. 8,730,276.

(30) Foreign Application Priority Data

May 29, 2009  (JP) .................................. 2009-131164
May 13, 2010  (TW) ................................ 99115346 A

(51) Int. Cl.
| | |
|---|---|
| G09G 5/10 | (2006.01) |
| G09G 3/32 | (2006.01) |
| G09G 3/00 | (2006.01) |
| G09G 3/20 | (2006.01) |
| G09G 3/34 | (2006.01) |
| H01L 51/00 | (2006.01) |
| H04N 5/14 | (2006.01) |

(Continued)

(52) U.S. Cl.
CPC .............. G09G 3/3225 (2013.01); G09G 3/00 (2013.01); G09G 3/2022 (2013.01); G09G 3/3233 (2013.01); G09G 3/346 (2013.01); H01L 51/00 (2013.01); H04N 5/142 (2013.01); H04N 5/57 (2013.01); H04N 5/70 (2013.01); G09G 5/10 (2013.01); G09G 2320/0261 (2013.01); G09G 2320/0266 (2013.01); G09G 2330/021 (2013.01); G09G 2340/0435 (2013.01); G09G 2360/16 (2013.01); G09G 2360/18 (2013.01); H04N 5/66 (2013.01)

(58) Field of Classification Search
None
See application file for complete search history.

(56) References Cited

U.S. PATENT DOCUMENTS

| | | | |
|---|---|---|---|
| 2003/0048285 A1* | 3/2003 | Okuzawa et al. ............. | 345/690 |
| 2004/0160439 A1 | 8/2004 | Xavier | |

(Continued)

FOREIGN PATENT DOCUMENTS

| | | |
|---|---|---|
| EP | 112318234 | 8/1999 |
| JP | 2003304400 | 10/2003 |

(Continued)

*Primary Examiner* — Jason Olson
(74) *Attorney, Agent, or Firm* — McKenna Long & Aldridge, LLP

(57) ABSTRACT

A display device which effectively reduces the occurrences of a false contour is provided. A driver digitally drives each pixel by obtaining a plurality of bit data from pixel data for one pixel to assign the plurality of bit data to a corresponding subframe; configuring one frame with a predetermined number of unit frames; and supplying corresponding bit data in each unit frame to each pixel. Specifically, an analyzing circuit 5-5 predicts a probability of occurrence of a false contour in one screen of the video signal based on the presence or absence of a true contour. A display method based on the video signal is set in accordance with an analysis result.

10 Claims, 9 Drawing Sheets

(51) Int. Cl.
*H04N 5/57* (2006.01)
*H04N 5/70* (2006.01)
*H04N 5/66* (2006.01)

(56) References Cited

U.S. PATENT DOCUMENTS

| | | |
|---|---|---|
| 2006/0017744 A1 | 1/2006 | Yamada |
| 2007/0279344 A1 | 12/2007 | Kimura et al. |
| 2008/0252567 A1 | 10/2008 | Kawabe |
| 2009/0010546 A1 | 1/2009 | Rossato et al. |
| 2010/0033497 A1 | 2/2010 | Ueno et al. |
| 2010/0085285 A1 | 4/2010 | Ozawa et al. |

FOREIGN PATENT DOCUMENTS

| | | |
|---|---|---|
| JP | 2005275315 A | 10/2005 |
| JP | 2005331891 A | 12/2005 |
| JP | 1696304 | 8/2006 |
| JP | 2007221821 | 8/2007 |
| JP | 2007249436 | 9/2007 |
| JP | 2010122493 | 6/2010 |
| JP | 2010145810 | 7/2010 |

* cited by examiner

DISPLAY DEVICE

This application is a Continuation of U.S. application Ser. No. 13/319,499 filed on Nov. 8, 2011, which is a National Stage Entry of International Application No. PCT/US2010/036384, filed May 27, 2010, and claims the benefit of Japanese Application No. 2009-131164, filed on May 29, 2009, and Taiwanese Application No. 099115346, filed on May 13, 2010, which are hereby incorporated by reference for all purposes as if fully set forth herein.

TECHNICAL FIELD

The present invention relates to a display device which performs display by digitally driving pixels arranged in a matrix pattern in accordance with pixel data included in a video signal.

BACKGROUND ART

A great deal of recent research and development has focused on improving organic EL displays. Self-luminous organic EL display devices are advantageous for achieving high contrast. Further, because organic EL elements have a high response rate, it is possible to display video including rapid movement without blur.

Currently, active matrix type displays, in which an organic EL element is driven by a thin film transistor (TFT), have become, in response to a demand for a high-definition and high-resolution display, the most commonly employed. Such displays are typically manufactured with an organic EL element disposed on a substrate on which a low temperature polysilicon TFT or the like is formed. Although a low temperature polysilicon TFT is suitable for use as a drive element of an organic EL display because of the TFT's high mobility and stable operation, there is still a problem of wide variation of characteristics such as the threshold or mobility. Uneven luminance becomes noticeable in a display when a constant current drive is applied in a saturation region resulting in non-uniformity among pixels. Thus, digital drive methods for reducing display unevenness by operating a TFT as a switch in a linear region are disclosed. For example, in the digital drives disclosed in JP 2005-275315 A (Patent Document 1) and JP 2005-331891 A (Patent Document 2), a plurality of subframes are used to achieve multiple gray levels because pixels are controlled in two values, illuminating or not illuminating (subframe type digital driving).

PRIOR ART DOCUMENTS

Patent Documents

Patent Document 1: JP 2005-275315 A
Patent Document 2: JP 2005-331891 A

SUMMARY OF THE INVENTION

Objects to be Achieved by the Invention

In conventional subframe type digital driving, false contours easily occur. Especially, suppression of false contours in a still image caused by a high-speed movement of sightline remains especially problematic. Patent Document 1 discloses a method for suppressing false contours by raising the frequency (refresh rate). However, as a higher frequency increases power consumption, constant driving at a high frequency is not preferable. Thus, if the refresh rate can be changed according to the nature of the video to be displayed, it becomes possible to limit the increase of the power consumption to an absolute minimum by using a high frequency only when video highly likely to cause a false contour is displayed.

It should be noted that, when changing the refresh rate, it is necessary that the likelihood that a video will cause a false contour be accurately determined. If the possibility of false contour display can be accurately detected, it becomes possible to determine a suitable frequency range. Then, effective control capable of simultaneously both suppressing false contours and reducing power consumption becomes possible. To the contrary, if the detection is inaccurate, the frequency may be raised or lowered more than necessary, and, thus, the effective combination of false contour suppression and reduced power consumption cannot be expected.

Means for Achieving the Objects

The present invention provides a display device that performs display by digitally driving pixels arranged in a matrix pattern in accordance with pixel data of a video signal. The display device comprises a driver that digitally drives each of the pixels by obtaining a plurality of bit data from the pixel data for one pixel to assign the plurality of bit data to a corresponding subframe, configuring one frame with a predetermined number of unit frames, and supplying corresponding bit data in each unit frame to each pixel; and an analyzing circuit that analyzes probability of occurrence of a false contour in one screen of the video signal based on presence or absence of a true contour, wherein a display method based on the video signal is changed in accordance with an analysis result of the analyzing circuit.

It is preferable that the analyzing circuit detects a number of false contour occurrence locations and a number of true contour occurrence locations based on video data for one screen to analyze the probability of occurrence of a false contour in a display of one screen based on a ratio of the detected numbers.

It is further preferable that the analyzing circuit divides one screen into a plurality of blocks and analyzes the probability of occurrence of a false contour in the display of one screen based on a ratio between a number of false contour occurrence locations and a number of true contour occurrence locations in the blocks.

It is further preferable that the driver changes a number of unit frames in one frame based on the result of the analysis performed by analyzing circuit.

It is further preferable that the analyzing circuit determines whether or not the false contour is likely to occur by comparing between pixel data of a target pixel and periphery pixel data around the target pixel.

It is further preferable that the pixel comprises an organic EL element.

Effects of the Invention

As described above, according to the present invention, it is possible to more accurately analyze the probability of occurrence of false contours to realize a suitable solution to the problem of false contours.

BEST MODE FOR CARRYING OUT THE INVENTION

Preferred embodiments of the present invention are described below with reference to the accompanying drawings.

Figure 1:
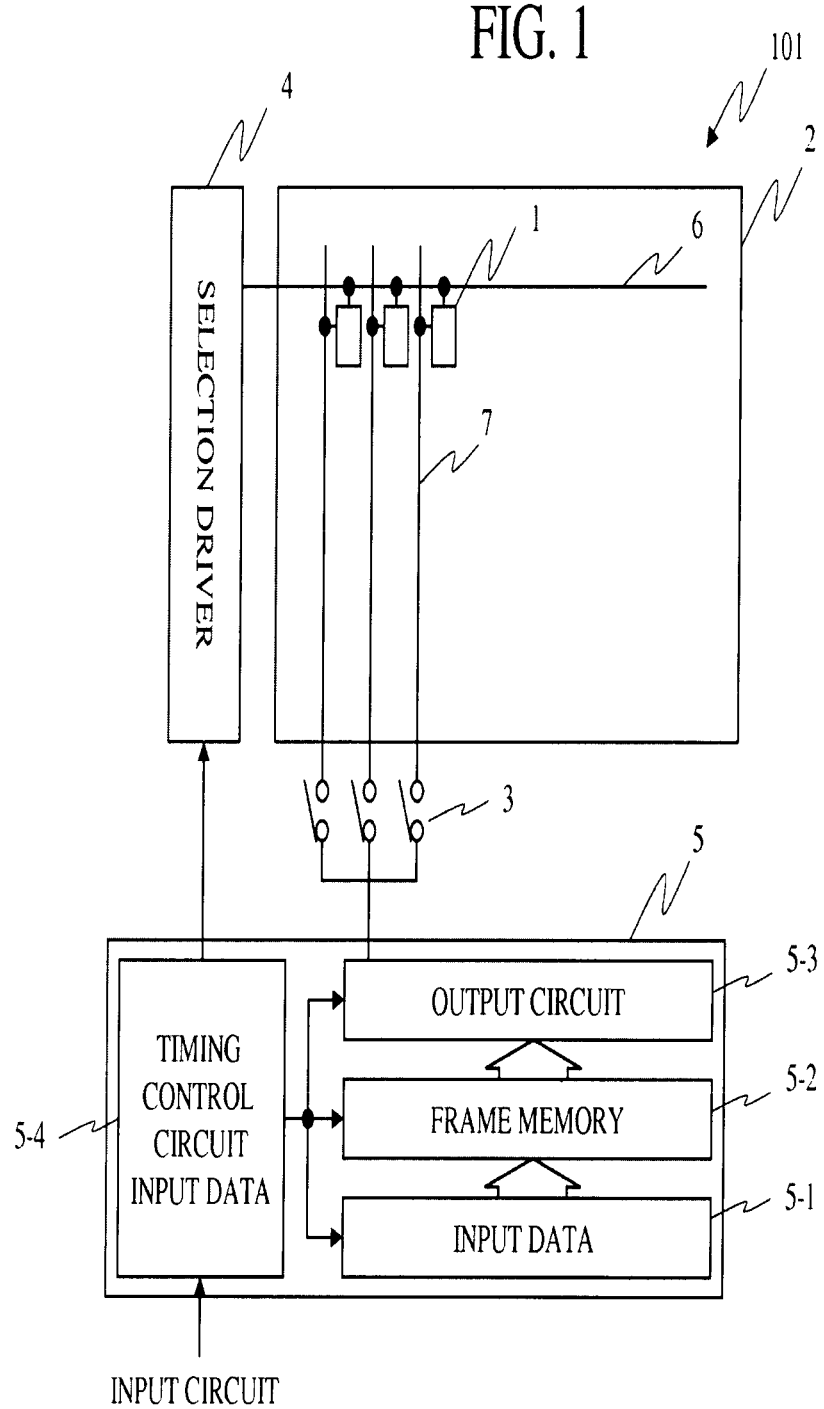
FIG. 1 is a diagram showing an overall configuration of a display device.

FIG. 1 shows an overall configuration of a display device 101 according to an embodiment of the present invention. The display device 101 includes a pixel array 2 in which pixels 1, each emitting any one of the colors, R (red), G (green), and B (blue), are arranged in a matrix pattern; a selection driver 4 for selectively driving selection lines 6; a data driver 5 for driving data lines 7, and multiplexers 3 for connecting an output from the data driver 5 to a data line 7 of R, G, or B. Each of the selection lines 6 is provided corresponding to each row of pixels 1, while each of the data lines 7 is provided corresponding to each column of pixels 1. Three pixels 1 of R, G, and B form one unit of full-color pixels for full colorization. A pixel 1 of W (white) may be added to these pixels to form a single unit of full-color pixels of RGBW. In such a case, a data line 7 of W is added and one of the multiplexers 3 is configured to be able to select the data line 7 of W.

The data driver 5 shown in FIG. 1 includes an input circuit 5-1, a frame memory 5-2, an output circuit 5-3, and a timing control circuit 5-4 to operate as a data driver with a built-in memory. Data per dot (pixel) from an external source is input to the timing control circuit 5-4 where a control signal is generated in accordance with the input data and supplied to the input circuit 5-1, frame memory 5-2, and output circuit 5-3.

The data per dot output from the timing control circuit 5-4 is converted by the input circuit 5-1 to data per line and stored in the frame memory 5-2 for each line. The data stored in the frame memory 5-2 is read out per line and transferred into the output circuit 5-3. The multiplexers 3 are selected in the order of, for example, R, G, and B. Then, upon sequential connection of each data line 7 of RGB to the output circuit 5-3, corresponding data per line is output to each data line 7 in the order of R, G, and B.

It should be noted that the input data may be input separately for each of R, G, and B; stored separately in each of the frame memory 5-2 separately provided for each of R, G, and B; and output sequentially from the output circuit 5-3. Alternatively, the input data of RGB may be input into the input circuit 5-1 after being arranged in the order of R, G, and B to form one unit of full color pixel data and then, all of the input data may be written into one frame memory 5-2.

As shown above, use of the multiplexers 3 can enable simplification of the configuration because the number of output lines required for the data driver 5 is only the number of units of full color pixels. Therefore, the multiplexers 3 are widely used for mobile terminals. For example, in a case of Quarter Video Graphics Array (QVGA) of 240×320, because the required number of output lines of the data driver 5 is only 240 minimizing the size of the output circuit 5-3, the use of the multiplexers 3 is advantageous for achieving low cost. Without the multiplexers 3, the required number of output lines would be 240×3=720 because the output lines of the data driver 5 should be respectively connected to the data lines 7 of R, G, and B.

The selection driver 4 selects a selection line 6 to which data is to be output at a timing when data is output into the data line 7. In this way, data is appropriately written into a pixel 1 of the corresponding line from the data driver 5. After the completion of the data writing, the selection driver 4 releases the selection of the corresponding line and repeats the operation of selecting and releasing each of subsequent lines. That is, the selection driver 4 should be operated to select only one line at a time.

The selection driver 4 is often provided as a low temperature polysilicon TFT on the same substrate as pixels. Alternatively, the selection driver 4 may be provided as a driver IC or assembled inside of the data driver 5.

Figure 2:
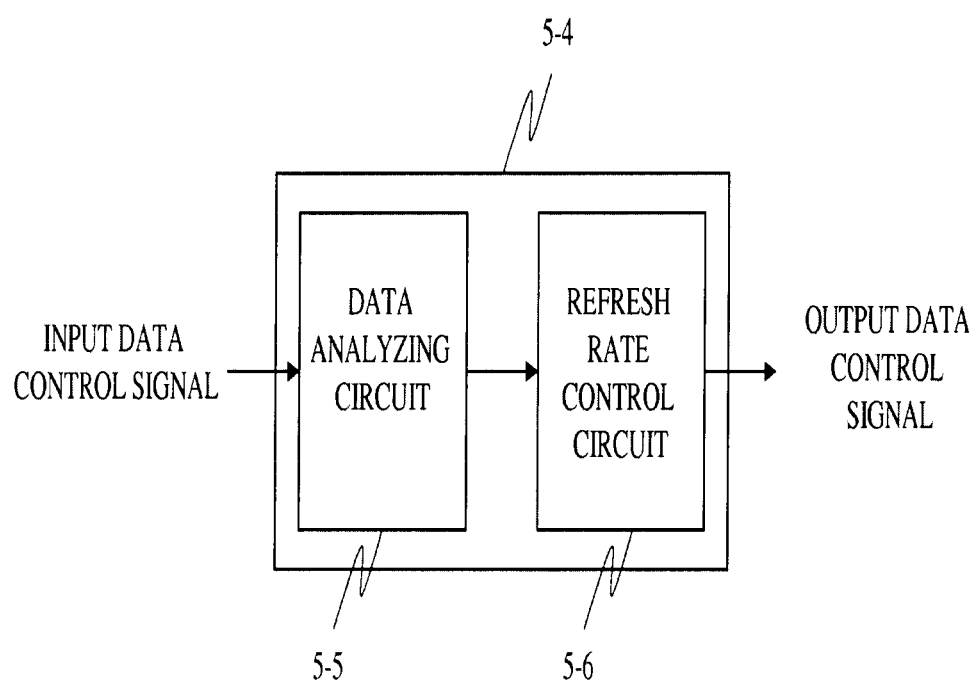
FIG. 2 is a diagram showing an internal configuration of a timing control circuit.

FIG. 2 shows an internal configuration of the timing control circuit 5-4. Input data per dot and an input control signal are first input into a data analyzing circuit 5-5 to be analyzed as to what type of data is included in video. Based on the results of this analysis, a refresh rate control circuit 5-6 outputs, with the video data, a control signal for generating a refresh rate which is optimum for the input video. The control signal which is output from the refresh rate control circuit 5-6 is supplied into the frame memory 5-2, output circuit 5-3, selection driver 4, and so forth. The display device 101 displays the video at the optimum refresh rate for the input video.

Figure 3:
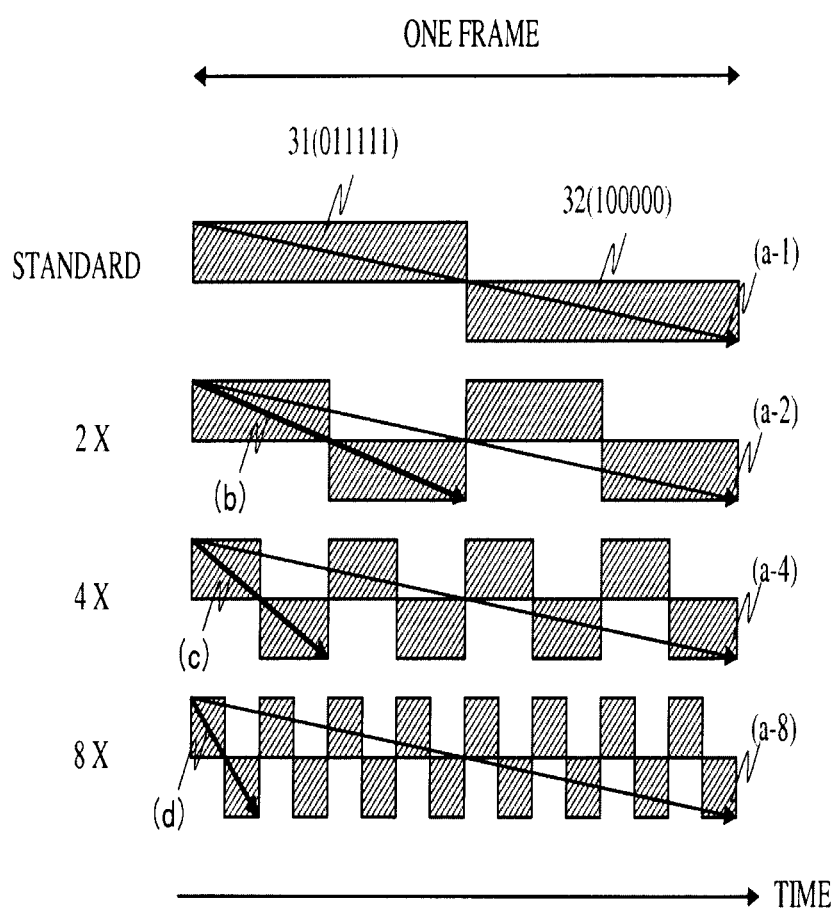
FIG. 3 is a diagram showing how a false contour appears in relation to a change in a refresh rate.

FIG. 3 shows variations of false contour appearances with different refresh rate settings of standard, 2×, 4× and 8× with respect to the refresh rate of input video when gray level data of "31 (011111)" and "32 (100000)" are adjacently displayed one above the other in 6 bit gray level display with each of subframes, SF0 to SF5, weighted to 1:2:4:8:16:32. The numbers shown in parentheses are bit data. The horizontal axis in FIG. 3 shows time. When a viewer's sightline moves from the top to the bottom, the viewer observes luminance patterns similar to those shown by arrows of (a-1) through (a-8) and (b), (c), and (d), which differ according to refresh rate. With the video displayed at a standard rate, that is, the same refresh rate as the input video it is intended that the viewer observe luminance with a luminance period of 31/63 or 32/64, however, when their sightline moves along (a-1), the viewer observes a luminance which continues for one full frame period, which appears as a false contour on the display.

On the other hand, if the refresh rate is set to 2× ("double-speed"), a frame period is shortened to half, and the video is formed quickly so that the display becomes relatively unaffected by movement of the sightline. This can be understood with reference to FIG. 3. If the movement speed of the sightline is the same as in the above example, the sightline movement is as shown by arrow (a-2), so the luminance which continues for the frame period is not observed even if a sight line movement starts at any time. Consequently, no false contours are visible. However, if the viewer's sightline moves faster, as shown by arrow (b), a luminance greater than an intended luminance is observed, resulting in appearance of a false contour on the display. This is also true with a refresh rate of four or eight times the base rate (4× or 8×). If the movement speed of the sightline is limited, such as along arrows (a-4) or (a-8), few false contours are observed.

However, if the movement speed of the sightline increases to a matching 4× or 8×, as in arrows (c) or (d), a luminance greater than the intended luminance is observed, resulting again in the appearance of a false contour. However, because the actual tracking speed of human sight is limited, a false contour is not observed if a display is refreshed at a frequency higher than a certain level. As such, in terms of preventing false contours, the higher the refresh rate, the better. According to experiments performed by the present inventors, no false contours were observed when a refresh rate of 4× or higher was employed. Experimental observations also confirmed that false contours could be restricted without raising the refresh rate to 8× by employing a refresh rate of about 4×, while shortening the luminance period by dividing the most significant bit (MSB) subframe or another equivalent subframe into two or more subframes.

However, input video does not necessarily include data which would cause a false contour. A higher refresh rate is preferable if input video includes data which causes a false contour as shown in FIG. 3, but if the input video does not include such data, a lower frequency is preferable in order to reduce power consumption.

It can be determined whether or not a false contour will appear in an input video by comparing bit arrangements of input data of adjacent pixels, as will explained next. Input video can be determined to cause a false contour when there is a significant difference in a comparison result between original data and data obtained by performing an OR operation on each bit data of adjacent pixel groups including the target pixel and the pixels adjacent to the target pixel including pixels above, below, to the right, left, and diagonal to the target pixel. As an example, a pixel having gray level data of "31 (011111)" and an adjacent pixel having gray level data of "32 (100000)" are considered in the following. The result of OR operation between these adjacent pixels is "63 (111111)". The obtained result is approximately twice the original data of "31". As shown in FIG. 3, because notable false contours may occur, it can be concluded that a standard refresh rate would be insufficient here. On the other hand, in an example in which the gray levels of adjacent pixels are "31 (011111)" and "30 (011110)", the result of OR operation is "31 (011111)". Because these values are roughly similar, it can be concluded that a standard refresh rate would be sufficient.

Even if gray level data of adjacent pixels are discontinuous, such as the values "33 (100001)" and "30 (011110)", it can be determined that these adjacent pixels will cause a false contour because the result of OR operation would be "63 (111111)". The OR operation and the data comparison enable identification of where a false contour is likely to occur. Such detection is possible also by bit operation other than the bit OR operation, such as bit AND operation. For example, in the above-described example of gray level data of "31 (011111)" and "32 (100000)", the result of respective bit AND operation is "0 (000000)", which is significantly different from the original "31 (011111)". On the contrary, with gray level data values of "31 (011111)" and "30 (011110)", the result of bit AND operation is "30 (011110)", which is very similar to the original gray level data. Therefore, it can be determined that no false contour will occur.

As described above, it is possible to detect whether or not a false contour will occur by comparing bit data of adjacent pixels. However, even if there are pixels which cause false contours (called as "false contour pixels" or "false contour occurrence locations"), false contours will not be apparent on the display if the number of such pixels is relatively small. The false contour pixels only influence the appearance of the display when there are some number of false contour pixels present in a certain display area. Because of such characteristics, it is possible to estimate a false contour degree by counting the approximate number of false contour pixels in a certain area.

Figure 4A:
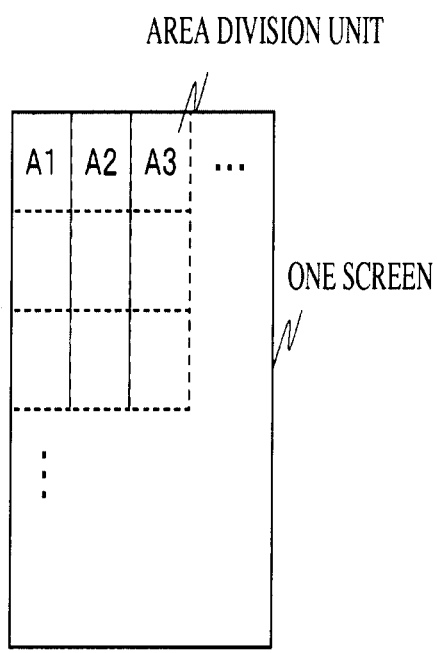
FIG. 4A is a diagram showing one screen with area division units.
Figure 4B:
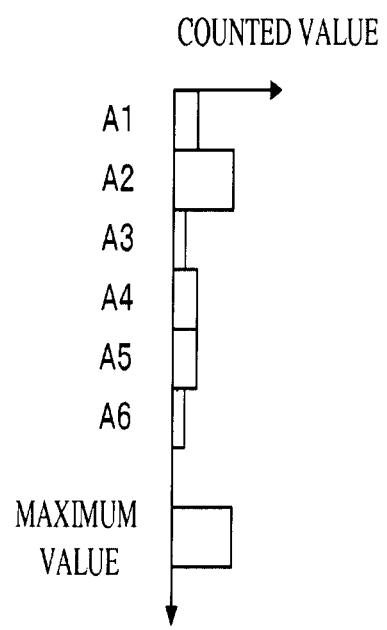
FIG. 4B is a graph showing a count value of false contour pixels for each area division unit.

For example, as shown in FIG. 4A, one screen is divided into a plurality of area division units (blocks), which may have fixed positions or which may periodically change positions. A histogram such as shown in FIG. 4B can be formed by counting false contour pixels in each area division unit (block). This histogram enables analysis to determine which areas includes a significant number of false contour pixels. It is possible to expect that false contours will be most apparent in the area which includes the greatest number of false contour pixels. Therefore, a refresh rate may be determined based on the number of false contour pixels in that area.

However, a count value obtained by simply counting false contour pixels may not accurately reflect the degree of visual perception of a false contour. For example, in an example of two video signals, a video "A" with a maximum count value of 100 and a video "B" with a maximum count value of 20, if the above-described control method is employed, the refresh rate of video A with 100 maximum count value is set higher than the refresh rate of video B. However, there are some situations where a higher refresh rate should be set for video B.

Figure 5A:
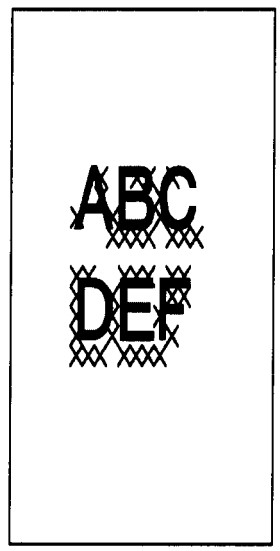
FIG. 5A is a diagram showing a false contour appearance with a true contour.
Figure 5B:
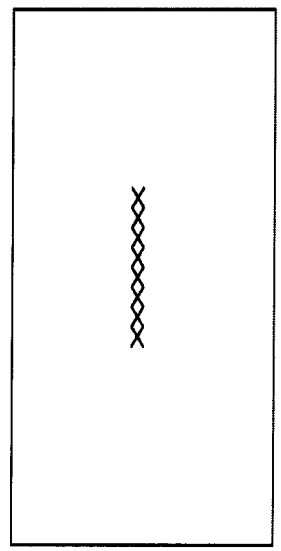
FIG. 5B is a diagram showing a false contour appearance without a true contour.

For example, as shown in FIG. 5A, false contour pixels (indicated by "X" marks) are not significantly noticeable when the false contour pixels are scattered around text. To the contrary, as shown in FIG. 5B, false contours become significantly noticeable when the false contours are arranged in a line against a plain background. This may be because false contours are not as noticeable with text because, unlike when viewing a plain background as shown in FIG. 5B, viewers will tend to focus their attention on the contours of the text. Further, another reason is that human eyesight tends to focus on objects with contours, so false contours are less likely to be noticeable when text or the like, on which sightlines tend to stay focused, is displayed. On the other hand, when a viewer watches video with false contours on a plain background as shown in FIG. 5B, the viewer's sightline moves from a place to place searching for a target to direct on which to focus their sight. As a result, a false contour which attracts the viewer's attention may be a source of repeated or continuous discomfort. On the other hand, in FIG. 5A, as the sightline is focused on the text, it is unlikely that the sightline will wander. Even if the sightline does wander to cause a false contour, the false contour is much less likely to register in the viewer's perception because of the strong impression created by the contour of the text.

The consideration of such characteristics of human vision in evaluation of count values of false contour pixels makes it possible to calculate values which more closely indicate actual visual perception.

There exist a variety of methods which may be employed for evaluating count values. The simplest and generally most effective method is to obtain a ratio (false contour contrast) between a count value of false contour pixels in each area division unit and a count value of true contours of video in the same area and then to calculate a contour contrast in the area division unit with the highest ratio. The calculation can be expressed by the following equation:

false contour contrast=count value of false contour pixels/count value of true contour pixels (Equation 1)

The false contour contrast becomes larger when false contours are located close to each other which makes the false contours more noticeable. The false contour contrast becomes much larger when fewer true contours exist in the background. The use of false contour contrast in this manner makes it possible to take account of not only the number of false contour pixels, but also the presence or absence of a true counter in the background of the false contour. Therefore, it is possible to quantitatively evaluate the noticeability of false contours so that an obtained value will much more closely reflect actual visual perception.

It should be noted that the false contour contrast can be obtained by raising the ratio between the count value of false contour pixels and the count value of true contour pixels to the power of ½, 1/n, or x. Alternatively, the false contour contrast may be defined by calculating the logarithm (LOG) value. When the false contour contrast is calculated in such a manner, it is possible to reduce the likelihood that the calculation will result in an extremely high false contour contrast, even when the denominator is small.

In the examples shown in FIGS. 5A and 5B, if the maximum count value of false contour pixels in FIG. 5A is 100 and in FIG. 5B is 20, the false contour contrast of FIG. 5A does not become higher than that of FIG. 5B as long as a true contour such as a text exists because the count value of true contour pixels in FIG. 5B is 0 in any area, even when the count value of FIG. 5A becomes very high. However, because it is impossible to calculate division of a number by 0 (zero), a finite value is set. A value close to actual visual perception can be obtained by appropriately setting this value.

Figure 6:
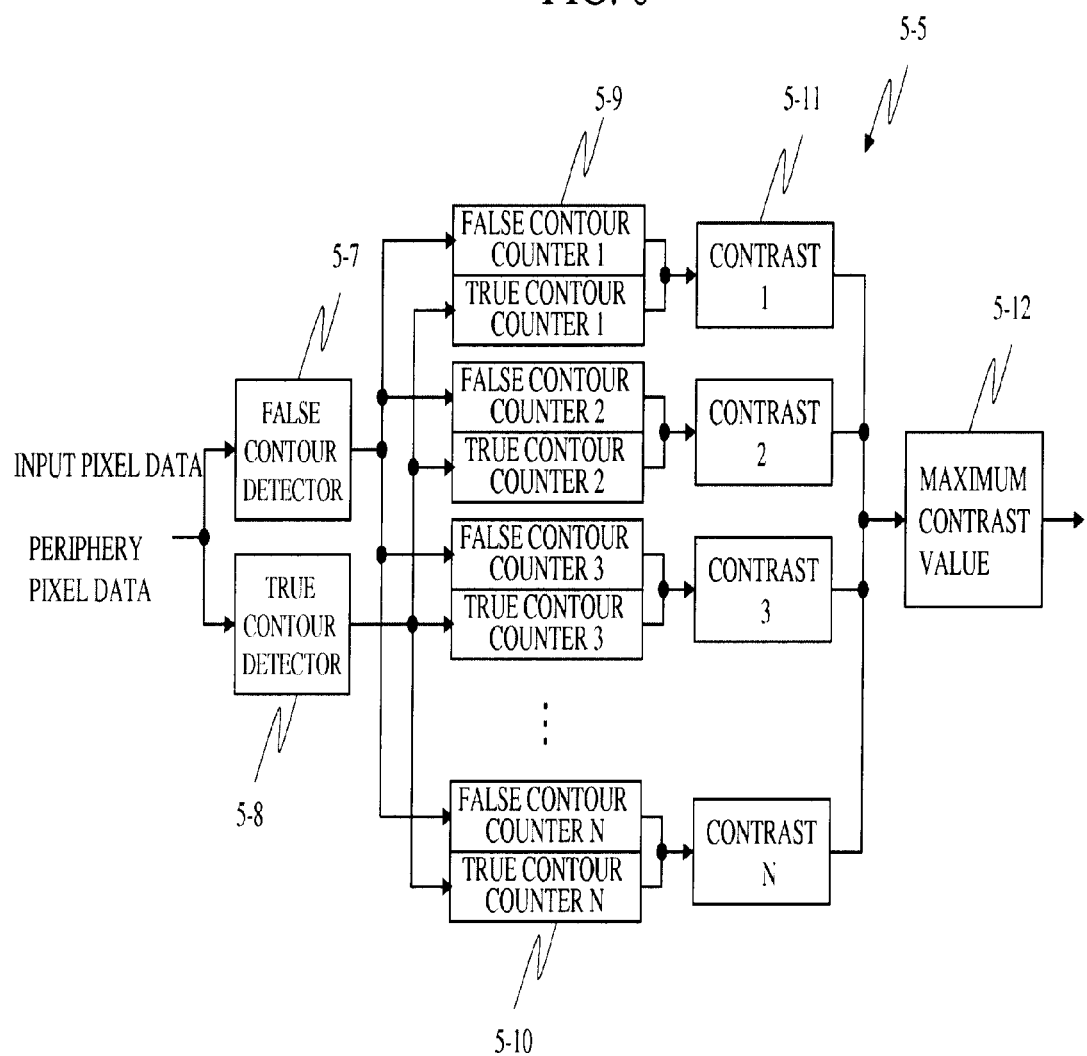
FIG. 6 is a diagram showing an internal configuration of a data analyzing circuit for one screen divided into N number of areas.

The processing of data in the evaluation method using the false contour contrast (false contour contrast method) will next be described in detail. FIG. 6 shows the internal configuration of a data analyzing circuit 5-5 in which the contour contrast method is applied with one screen divided into N number of areas. Pixel data and periphery pixel data which are simultaneously input into the data analyzing circuit 5-5 are first entered into a false contour detector 5-7 and a true contour detector 5-8. The false contour detector 5-7 estimates, by bit operation or the like, whether or not a particular pixel will cause a false contour. When it is determined that a pixel is likely to cause a false contour, a false contour counter 5-9 of the area to which the pixel belongs increases its count. The true contour detector 5-8 determines to what extent true contours are included in the video. For example, it may be determined that a true contour exists when a difference between pixel data and periphery pixel data is larger than a certain value to count up a true contour counter 5-10 of the area to which the pixel belongs (true contour pixel, true contour occurrence location). The false contour counter 5-9 may increase its count by one when a false contour pixel is present, and the true contour counter 5-10 may increase its count by one when a true contour pixel is present. Alternatively, these counters may add a value corresponding to the possibility that false contours are present. Further, a value corresponding to the possibility that true contours are present can be added to the counter by adding a difference between the pixel data and the periphery pixel data.

Additionally, it is preferable to detect a false or true contour in each of RGB colors and to use a highest value among the detected values as a representative value for a full color unit pixel. More specifically, pixel data and periphery pixel data for each of RGB colors may be simultaneously entered into the false contour detector 5-7 and the true contour detector 5-8. A false contour possibility and a true contour possibility may be respectively calculated. It is preferable that the count of the false contour counter 5-9 and the true contour counter 5-10 be based on the highest value.

The false contour counter 5-9 and the true contour counter 5-10 are reset and initialized to 0 (zero) at the starting point of each frame. Pixel data is usually input from the top left to the bottom right of a screen. Therefore, it is possible to identify an area division unit to which the pixel belongs based on the input data sequence. Therefore, a pixel for which a false contour or a true contour is detected causes the count of one of either the false contour counter 5-9 or the true contour counter 5-10 of the area to which the pixel belongs to increase. When one frame period is finished, the number of false contour pixels and true contour pixels for one screen is counted by the counters.

When a detection for one screen is finished, a false contour contrast for each area is calculated by a calculation unit 5-11 based on values from the false contour counter 5-9 and the true contour counter 5-10. The maximum value among the calculated values is stored in a register 5-12. A single shared calculation unit 5-11 may used to calculate a false contour contrast to obtain the maximum value by sequentially calculating false contour contrast values using values obtained from the false contour counters 1 to N and the true contour counters 1 to N. The refresh rate control circuit 5-6 adjusts the refresh rate based on this maximum value to output control signals and video data such that the video is displayed at an optimum refresh rate.

It is preferable that the refresh rate be set by calculating contour contrast per frame as shown above, because this makes it possible for the device to quickly respond to video in which images are quickly switched. However, if video moving image is not so often displayed, the false contour contrast for one screen may be obtained for a plurality of frames. In such a case, because false contour counters 5-9 and true contour counters 5-10 for a full N number of divisions are not necessary, some of the counters may be omitted. For example, if a detection for one area division unit is performed using one frame, because detection for one screen can be performed with N number of frames, only one false contour counter 5-9 and one true contour counter 5-10 are required.

Alternatively, the contour contrast may be calculated by using the count value of true contour for one screen by providing the division number N of false contour counters 5-9 with one true contour counter 5-10. This configuration also makes it possible to sufficiently display contours resulting in the contour contrast of FIG. 5B higher than that of FIG. 5A.

Figure 7:
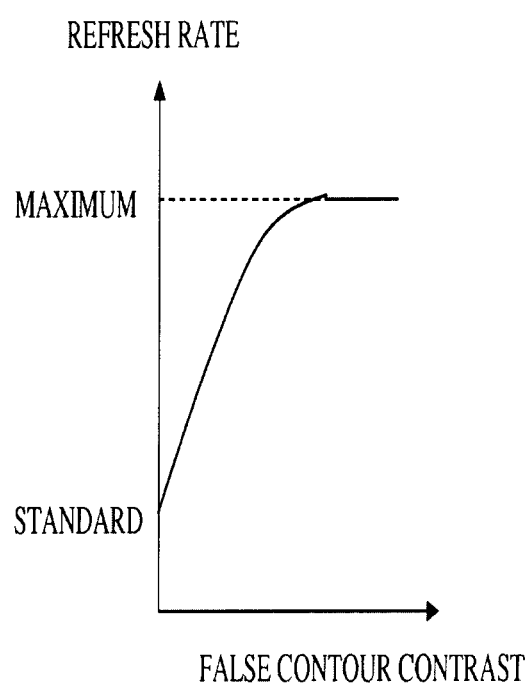
FIG. 7 is a graph showing a relationship between a false contour contrast and a refresh rate.

FIG. 7 shows an example of setting of a refresh rate in accordance with the false contour contrast. Basically, the refresh rate is set higher as the false contour contrast becomes larger. In the example shown in FIG. 7, the refresh rate is rapidly increased when the false contour contrast is low, but then slowly changed after the false contour contrast reaches a certain level. However, the refresh rate need not necessarily have such smoothly continuous change characteristics. Instead, the refresh rate may have characteristics such that the refresh rate may be changed to an integral multiple in a step-wise fashion or changed in a linear fashion. The false contour contrast and the refresh rate may be associated by a look-up table or the like, which may be provided within a refresh rate control circuit 5-6. More specifically, when the maximum false contour contrast value calculated by the data analyzing circuit 5-5 is entered into the refresh rate control circuit 5-6, a refresh rate is set in accordance with the lookup table. The refresh rate control circuits-6 outputs control signals and video data to enable driving of the pixel array 2 at a desired refresh rate.

Figure 8:
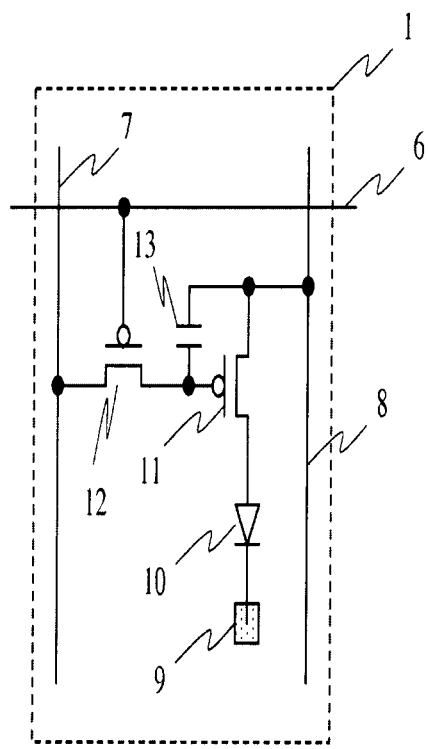
FIG. 8 is a diagram showing a configuration of a pixel circuit.
Figure 9:
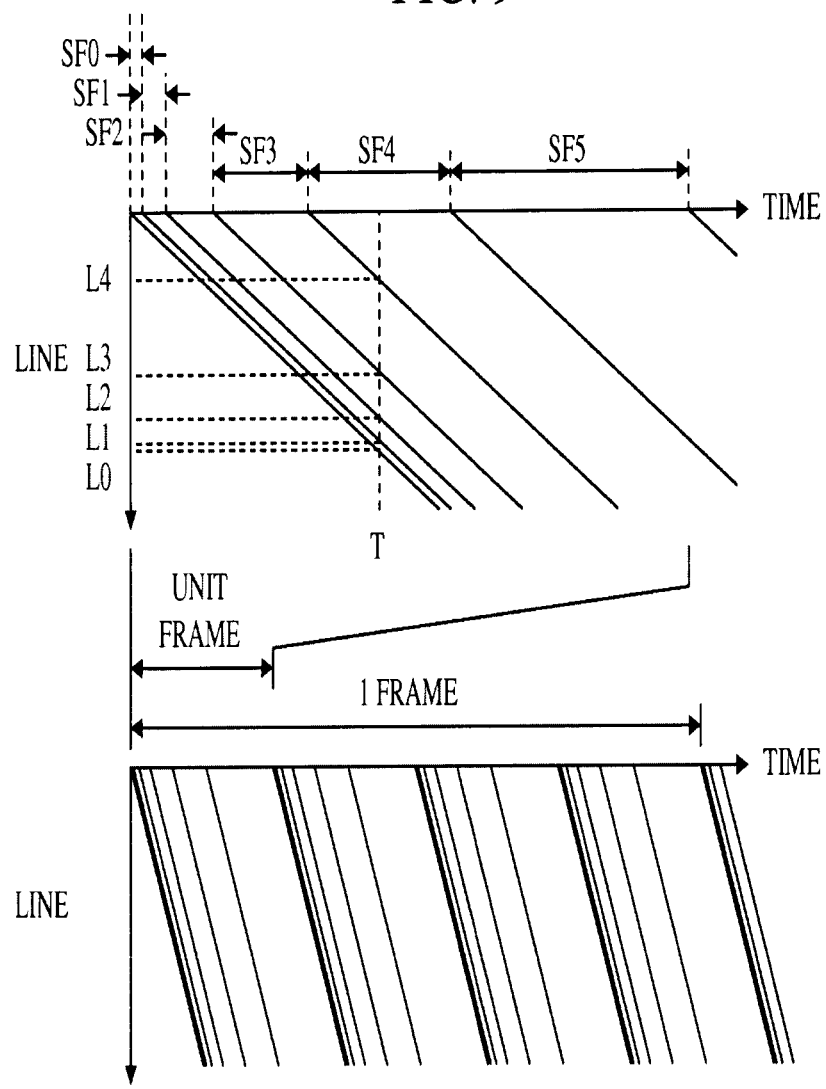
FIG. 9 is a diagram showing an increasing refresh rate.

FIG. 8 shows the configuration of a pixel 1, while FIG. 9 shows, as an example of an acceleration of refresh rate, a quad-speed digital drive timing chart. As shown in FIG. 8, the pixel 1 includes an organic EL element 10, a drive transistor 11, a selection transistor 12, and a storage capacitor 13. An anode and a cathode of the organic EL element 10 are respectively connected to a drain terminal of a drive transistor 11 and a cathode electrode 9 common to all of the pixels. A source terminal of the drive transistor 11 is connected to a power line 8 common to all of the pixels, while a gate terminal is connected to one end of the storage capacitor 13 and also to a source terminal of the selection transistor 12. The other end of the storage capacitor 13 is connected to the power line 8. A gate terminal and a drain terminal of the selection transistor 12 are respectively connected to a selection line 6 and a data line 7. It should be noted that the power line 8 and the cathode electrode 9 are not illustrated in the overall configuration shown in FIG. 1.

When a selection line 6 is selected (made low) by the selection driver 4, the selection transistor 12 is turned ON and a data potential supplied to the data line 7 is applied to the gate terminal of the drive transistor 11 to control ON/OFF of the drive transistor 11. For example, when the data potential of the data line 7 is low, the drive transistor 11 is turned ON to cause an electric current to flow through the organic EL element 10, which illuminates accordingly. To the contrary, when the data potential of the data line 7 is high, the drive transistor 11 is turned OFF so that no electric current will flow through the organic EL element 10, which is turned OFF accordingly. The data potential applied to the gate terminal of the drive transistor 11 is stored in the storage capacitor 13. Therefore, even if the selection transistor 12 is turned OFF (made high) by the selection driver 4, the ON/OFF state of the drive transistor 11 is maintained. The organic EL element 10 maintains its illumination state (ON or OFF) until the next subframe is accessed. It should be noted that although the pixel 1 in FIG. 8 includes only P-type transistors, it is also possible to include both P-type and N-type transistors or to use only N-type transistors. Furthermore, the pixel 1 may have a configuration other than the conventional configuration shown in FIG. 8.

FIG. 9 (top section) shows a subframe structure in a unit frame period in which 6-bit gray level display is possible by 6 subframes. That is, the 6-bit gray level can be displayed by one unit frame alone. A 6-bit display may start with the least significant bit, SF0, and complete with the most significant bit, SF5. However, subframes are not necessarily used in this order, from the least significant bit to the most significant bit. Instead, the order may be from the most significant bit to the least significant bit, or a random order may be used. When a display device as shown in FIG. 1 is used to perform driving as illustrated in the top section in FIG. 9, it is necessary that each line, L0 to L4, be selected in a time-division manner at time T, while bit data should be controlled to be written into a corresponding line. More specifically, a time-division selection should be performed such that, at time T, data of bits, 0, 1, 2, 3, and 4 is respectively written into the lines L0, L1, L2, L3, and L4. As an example of such a control method is described in detail in Patent Document 2, an explanation is not provided here.

If the unit frame period shown in FIG. 9 (top section) is, for example, a ¼ frame period, four unit frames constitutes one frame period as shown in the bottom section of FIG. 9, resulting in display at a 4× speed. That is, a refresh rate can be changed by changing the unit frame period. Therefore, the refresh rate control circuit 5-6 generates a subframe timing shown in FIG. 9 by setting a clock cycle or horizontal period to change a refresh rate in such a manner that a unit frame period corresponds to a set refresh rate.

It should be noted that, although the pixel 1 illustrated in FIG. 8 is configured by a single pixel, the pixel 1 may comprise two or more sub-pixels. With such configurations, it is still possible to change the refresh rate to reduce false contours in a similar manner.

Further, it is obvious that the techniques of embodiments according to the present invention are applicable to all types of organic EL displays such as a microdisplay; self-emitting displays such as a plasma display, field emission display, and inorganic EL display; and optical devices such as a Digital Micromirror Device (DMD), when they are driven in subframe type digital drive.

The invention claimed is:

1. A method for reducing the visibility of false contours in a digitally driven display device, the method comprising:
   receiving pixel data for a plurality of pixels in a frame to be displayed on the display device;
   comparing pixel data for one or more pixels in the frame with pixel data for one or more adjacent pixels to determine a number of false contour occurrence locations and a number of true contour occurrence locations for the frame;
   computing a probability of occurrence of a false contour in the frame based on a ratio between the number of false contour occurrence locations for the frame and the number of true contour occurrence locations for the frame; and
   generating a plurality of subframes to represent the frame for driving the display device, wherein a number of subframes is set in accordance with the probability of occurrence of a false contour in the frame.

2. The method according to claim 1, wherein the comparing step uses a logical OR operation to determine the number of false contour occurrence locations.

3. The method according to claim 1, wherein the comparing step uses a logical AND operation to determine the number of false contour occurrence locations.

4. The method of claim 1, wherein the number of subframes is set in proportion to the probability of occurrence of a false contour in the frame.

5. The method of claim 1, wherein the number of subframes is an integral multiple of a base number of subframes, wherein the base number of subframes is the number of subframes used when the probability of occurrence of a false contour is zero.

6. A method for reducing the visibility of false contours in a digitally driven display device, the method comprising:
   receiving pixel data for a plurality of pixels in two or more blocks of pixels within a frame to be displayed on the display device;
   comparing, for each block of pixels, pixel data for each pixel in an associated block of pixels with pixel data for one or more adjacent pixels to determine a number of false contour occurrence locations and a number of true contour occurrence locations for the associated block of pixels;
   computing a probability of occurrence of a false contour in each block of pixels based on a ratio between the number of false contour occurrence locations in the associated block of pixels and the number of true contour occurrence locations in the associated block of pixels; and generating a plurality of subframes to represent the frame for driving the display device, wherein a number of subframes is set in accordance with the probability of occurrence of a false contour in one or more blocks of pixels in the frame.

7. The method of claim 6, wherein the comparing step uses a logical OR operation to determine the number of false contour occurrence locations.

8. The method of claim 6, wherein the comparing step uses a logical AND operation to determine the number of false contour occurrence locations.

9. The method of claim 6, wherein the number of subframes is set in proportion to the probability of occurrence of a false contour in one or more blocks of pixels in the frame.

10. The method of claim 6, wherein the number of subframes is an integral multiple of a base number of subframes, wherein the base number of subframes is the number of subframes used when the probability of occurrence of a false contour is substantial close to zero.

* * * * *